(12) United States Patent
Hendriks et al.

(10) Patent No.: US 11,089,690 B2
(45) Date of Patent: Aug. 10, 2021

(54) METHOD FOR DEPOSITING A FUNCTIONAL MATERIAL ON A SUBSTRATE

(71) Applicant: NCC NANO, LLC, Dallas, TX (US)

(72) Inventors: Rob Jacob Hendriks, Eindhoven (NL); Kurt A. Schroder, Coupland, TX (US); Charles C. Munson, Dallas, TX (US)

(73) Assignee: NCC NANO, LLC, Dallas, TX (US)

( * ) Notice: Subject to any disclaimer, the term of this patent is extended or adjusted under 35 U.S.C. 154(b) by 386 days.

(21) Appl. No.: 15/072,180

(22) Filed: Mar. 16, 2016

(65) Prior Publication Data

US 2017/0268100 A1 Sep. 21, 2017

(51) Int. Cl.
*H05K 3/04* (2006.01)
*H05K 3/20* (2006.01)

(52) U.S. Cl.
CPC ............ *H05K 3/046* (2013.01); *H05K 3/207* (2013.01); *H05K 2203/107* (2013.01)

(58) Field of Classification Search
None
See application file for complete search history.

(56) References Cited

U.S. PATENT DOCUMENTS

| | | | | |
|---|---|---|---|---|
| 5,156,938 A | * | 10/1992 | Foley | B41M 5/24 346/135.1 |
| 2010/0015424 A1 | * | 1/2010 | Seo | H01L 51/0013 428/216 |
| 2011/0097550 A1 | | 4/2011 | Matusovsky et al. | |
| 2012/0251772 A1 | * | 10/2012 | Aoyama | H01L 51/0013 428/138 |
| 2015/0086705 A1 | | 3/2015 | Meinders et al. | |

FOREIGN PATENT DOCUMENTS

EP 2660352 A1 * 11/2013 ............. C23C 14/28

\* cited by examiner

*Primary Examiner* — Joel G Horning
(74) *Attorney, Agent, or Firm* — Antony P. Ng; Russell Ng PLLC

(57) ABSTRACT

A method for depositing a functional material on a substrate is disclosed. An optically transparent plate having a first surface and a second surface with one or more wells is provided. After coating the second surface with a thin layer of light-absorbing material, the wells are filled with a functional material. The plate is then irradiated with a pulsed light to heat the layer of light-absorbing material in order to generate gas at an interface between the layer of light-absorbing material and the functional material to release the functional material from the wells onto a receiving substrate located adjacent to the plate.

8 Claims, 4 Drawing Sheets

METHOD FOR DEPOSITING A FUNCTIONAL MATERIAL ON A SUBSTRATE

BACKGROUND OF THE INVENTION

1. Technical Field

The present invention relates to printing processes in general, and, in particular, to a method for selectively depositing a functional material on a substrate.

2. Description of Related Art

A common method for selectively depositing a functional material on a substrate is via printing. The functional material needs to be formulated with other materials before the functional material can be printed on a substrate. A formulation can typically be formed by dispersing the functional material in a solvent or liquid; thus, the formulation is generally wet. The formulation is often referred to as an ink or paste, depending on the viscosity.

A formulation (either ink or paste) typically includes certain additives intended to make the printing process easier and more reliable, but those additives may also interfere with the properties of the functional material. If the additives within the formulation do not substantially interfere with the intended functions of the functional material to be deposited, the additives can stay; otherwise, the additives must be removed. The removal of additives can be somewhat inconvenient if not impossible.

Consequently, it would be desirable to provide an improved method for printing a functional material on a substrate.

SUMMARY OF THE INVENTION

In accordance with a preferred embodiment of the present invention, an optically transparent plate having a first surface and a second surface with one or more wells is provided. After coating the second surface with a thin layer of light-absorbing material, the wells are filled with a functional material. The plate is then irradiated with a pulsed light to heat the layer of light-absorbing material in order to generate a gas at an interface between the layer of light-absorbing material and the functional material to release the functional material from the wells onto a receiving substrate.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Ideally, instead of printing a functional material on a substrate, selectively depositing a pure functional material on a substrate is most preferable, but it is almost never done. To a certain extent, printing a near pure functional material, such as pastes with high solids content, can be performed by using a Laser Induced Forward Transfer (LIFT) process.

Figure 1A:
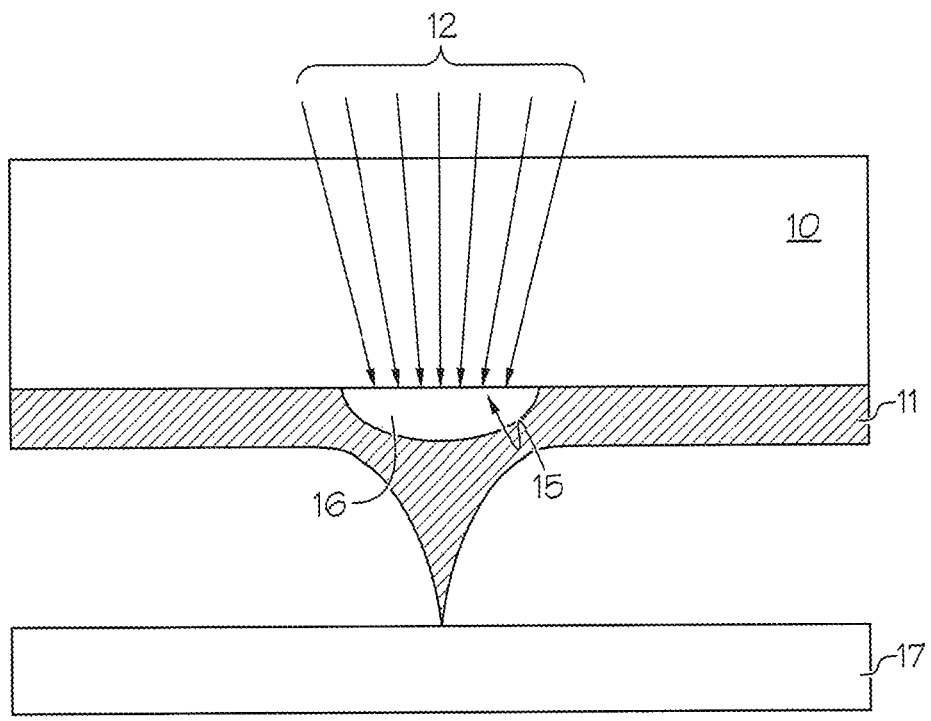
FIGS. 1A-1B depict a laser induced forward transfer process.
Figure 1B:
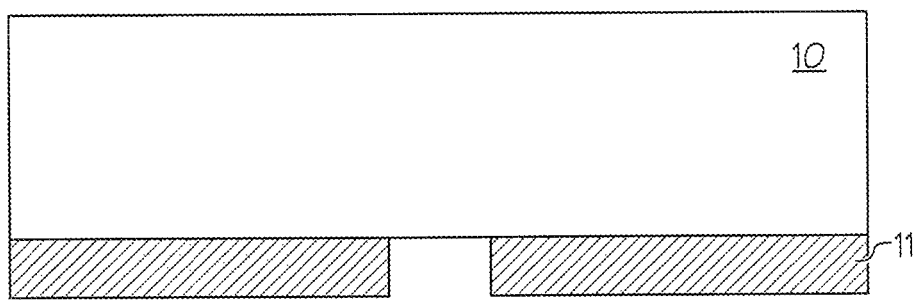
Figure 1B:
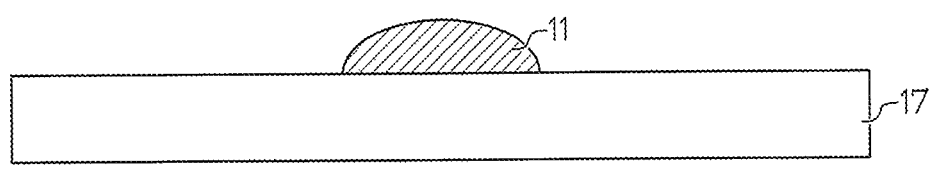

Referring now to the drawings and in particular to FIGS. 1A-1B, there is depicted the LIFT process. Initially, a functional material 11 is placed on one side of a donor substrate 10 that is at least partially optically transparent. A laser beam 12 is then focused on the other side of donor substrate 10 to a point near an interface 15 between functional material 11 and donor substrate 10, as shown in FIG. 1A. A gas 16 is generated at interface 15 that propels functional material 11 onto a receiver substrate 17, as shown in FIG. 1B.

There are several disadvantages to the LIFT process. First, the thicker the deposition, the lower the resolution of a final print. Second, since only a single spot of functional material can be transferred at a time, the LIFT process can only be performed in a serial manner. Third, there is a considerable amount of waste in the LIFT process because only a relatively small portion of the functional material on the donor substrate is utilized. Finally, and perhaps the biggest disadvantages of the LIFT process is that there are specific requirements on the dynamic characteristics of the functional material to be printed. In other words, the LIFT process is not suitable for all types of functional materials, and the printing parameters need to be fine-tuned for each type of functional materials. The margin of error for the tuning is relatively small because the homogeneity of the layer thickness and the viscosity will vary across the entire donor substrate.

Figure 2:
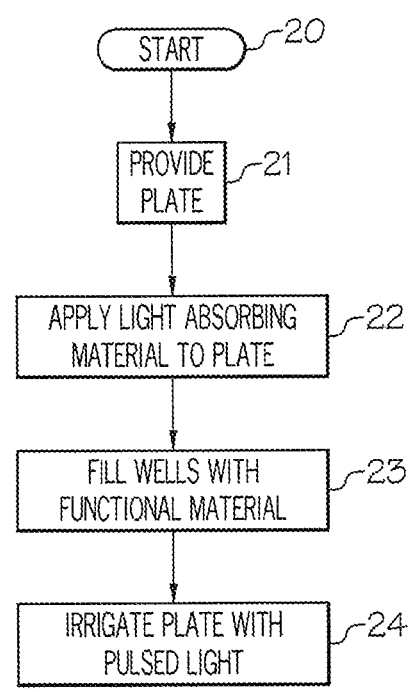
FIG. 2 is a flow diagram of a method for depositing a functional material on a substrate, in accordance with a preferred embodiment of the present invention.
Figure 3A:
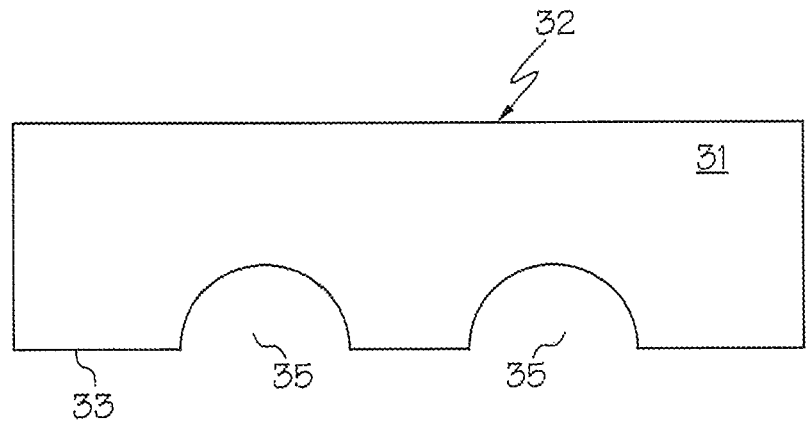
FIGS. 3A-3E illustrate the method of FIG. 2.

With reference now to FIG. 2, there is illustrated a method for depositing a functional material on a substrate, in accordance with a preferred embodiment of the preset invention. Starting at block 20, an optically transparent plate is provided, as shown in block 21. The optically transparent plate is preferably made of quartz. The optically transparent plate, which is depicted as a plate 31 in FIG. 3A, includes a first surface 32 and a second surface 33. First surface 32 is preferably flat, but it can also be curved. Second surface 33 is preferably dimpled with multiple wells 35. Although multiple wells are shown in FIG. 3A, it is understood by those skilled in the art that second surface 33 may have only one well.

Figure 3B:
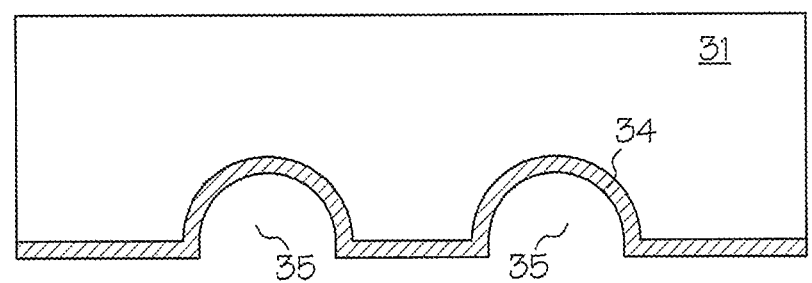

A thin light-absorbing material layer 34 is then applied to second surface 33 of plate 31, as depicted in block 22 and in FIG. 3B. Light-absorbing material layer 34 needs to be thermally stable (i.e., thermal shock resistant). Preferably, light-absorbing material layer 34 is made of tungsten.

Figure 3C:
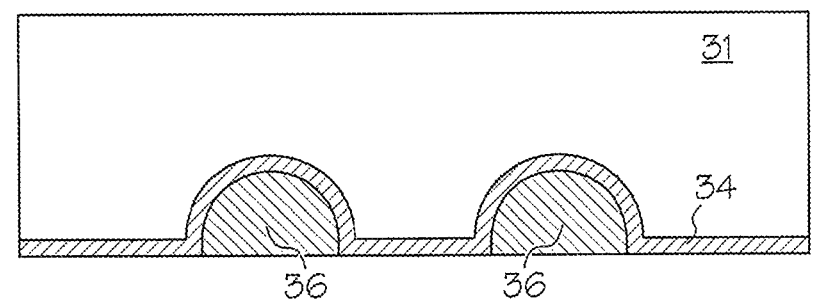
Figure 3D:
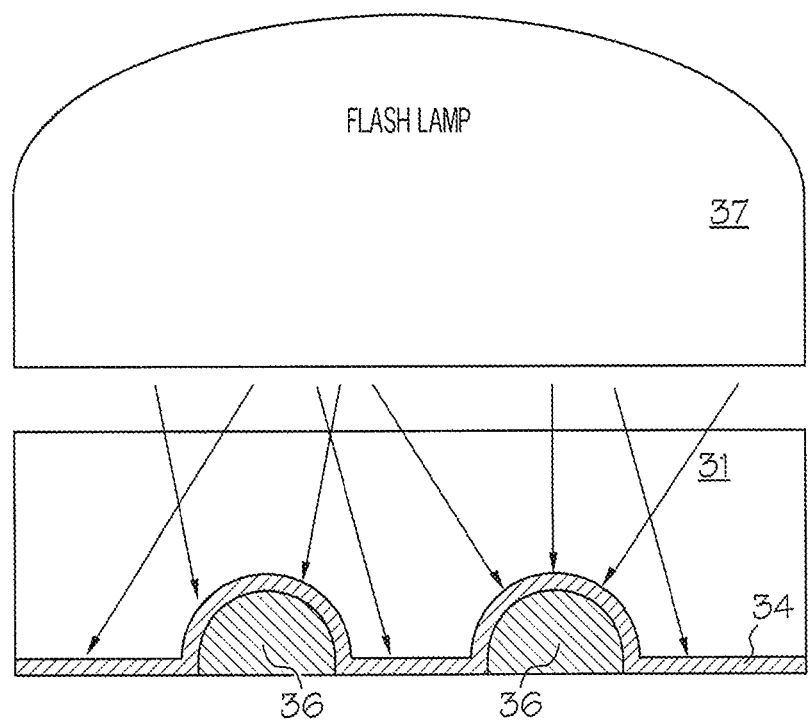

Next, wells 35 of plate 31 are then filled with a functional material 36, as shown in block 23 and in FIG. 3C. Functional material 36 can be in the form of an ink or paste. A squeegee or doctor blade can be utilized to fill wells 35 with functional material 36. After wells 35 have been filled with functional material 36, plate 31 is irradiated by a pulsed light, preferably on first surface 32, as depicted in block 24 and in FIG. 3D. Preferably, the pulsed light is generated by a flashlamp 37.

Figure 3E:
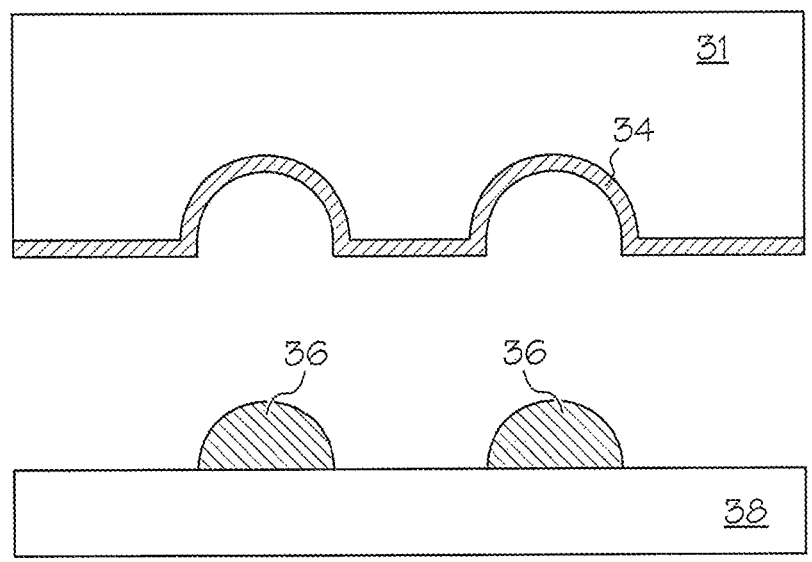

When the pulsed light hits plate 31, a portion of the photons are converted into phonons that subsequently heat light-absorbing material layer 34. While light-absorbing material layer 34 is being heated, functional material 36 within wells 35 will be heated through thermal diffusion (primarily conduction). When the boiling or sublimation phase change temperature of one or multiple components of functional material 36 has been reached at an interface between light-absorbing material layer 34 and functional material 36, gas is generated at the interface between light-absorbing material layer 34 and functional material 36. The gas then expels functional material 36 from plate 31 to a receiving substrate 38, as shown in FIG. 3E. The transfer of functional material 36 may also be assisted by gravity.

The above-mentioned steps may be repeated by re-applying the functional material to wells 35 of plate 31 followed by another exposure of pulsed light from flashlamp 37 to expel the functional material from wells 35 onto receiving substrate 37.

The shape of wells 35 can be adjusted to help controlling the expulsion of functional material 36, and to improve the filling of functional material 36.

It is important to supply a uniform application of heat onto light-absorbing material layer 34 in order to make sure functional material 36 is heated in a consistent manner such that functional material 36 in wells 35 loses adhesion to plate 31 at the same time. If not, functional material 36 will be ejected in an inconsistent direction. Furthermore, if functional material 36 were to be inconsistently heated, functional material 36 could have inconsistent properties after expulsion. An ejection of functional material 36 from wells 35 undergoes almost no shear stress.

A uniform application of heat on light-absorbing material layer 34 is preferably achieved by using a non-collimated light source with a spatially uniform beam profile. As each of wells 35 has a curved surface, the radiant power at the surface of wells 35 is proportional to the cosine of the incident angle of the light impinging upon them. Thus, a collimated beam of light would not produce a uniform heating profile unless the spatial intensity of the beam varied as the l/cosine of the incident angle of the light over each of wells 35. This problem does not exist when the pulsed light is non-collimated.

An example of a non-collimated light source that can have a spatially uniform beam intensity is flashlamp 37 mentioned above. Another example of a non-collimated source is a laser coupled to a waveguide. The laser alone is a coherent source, but after passing through a waveguide, a laser beam from the laser loses its coherency, and therefore becomes non-collimated. When the intensity of the laser beam is spatially uniform, a uniform heating of light-absorbing material layer 34 can be achieved.

In order to use a flashlamp, such as flashlamp 37, as a light source, the flashlamp preferably has a beam uniformity of less than 5% and more preferably less than 2%, and the intensity is preferably greater than 5 KW/cm$^2$, and more preferably, greater than 10 KW/cm$^2$. In addition, the pulse of light is preferably be less than 1 ms, and more preferably less than 0.2 ms. The higher the thermal diffusivity of plate 30 and light-absorbing material layer 34, the higher the intensity and the shorter the pulse length are required. The uniformity of the intensity of the beam is preferably less than 5%, and more preferably less than 2%.

If an under-powered flashlamp were to be used, then functional material 36 would not be properly released from wells 35. More specifically, if a pulse of light with too low of an intensity is used, a longer time duration is required to reach the temperature required for ejecting functional material 36 from plate 31. This means that due to thermal diffusion, more of functional material 36 will be heated before it is eventually ejected. This is undesirable for many type of functional materials. Thus, for smaller wells, a higher amount of functional material 36 will be affected.

Since the source of light is noncollimated, it is possible to utilize the present invention to print functional material onto a nonplanar substrate, e.g., a three-dimensional structure. In this case, the surface having the wells may be discontinuous or curved to match the surface of the receiving substrate. This may have useful applications such as printing an antenna onto a curved surface either concave or convex or even over discontinuous surfaces.

The following are additional types of layers that allow the method of the present invention to be even more flexible and more advantageous.

Reflective Layer

A reflective layer can be applied on second surface 33 of plate 31 before the application of light-absorbing material layer 34 on second surface 33 of plate 31. The reflective layer can then be selectively etched away before light-absorbing material layer 34 is applied. When having a high contrast ratio between the reflective layer and light-absorbing material layer 34, it is possible to only reach the phase change temperature within well 36 and not on the flat part of plate 31. As filling wells 35 might not be a 100% clean process, the reflective layer prevents that functional material 36 on the flat part of plate 31 does not reach the phase change temperature. A possible material for the reflective layer is aluminum.

Thermal Buffer Layer

A thermal buffer layer can be applied on second surface 33 of plate 31 before the application of light-absorbing material layer 34 on second surface 33 of plate 31. The thermal buffer layer exhibits a low thermal conductivity. When the thermal buffer layer has a lower thermal conductivity than plate 31, it retards the heat pulse from light-absorbing material layer 34 on the flat part of plate 31.

An example of a thermal buffer layer is a polymer such is polyimide. Polyimide has a thermal conductivity of about 0.5 W/m-K, which is a factor of approximately 2.5 lower than that of quartz. The thickness of the thermal buffer layer is preferably less than 10 micron.

Release Layer

Before an application of functional material 36, a thin layer of material having a relatively low boiling point may be applied to facilitate the release of functional material 36 from plate 31. The application can be performed by a number of deposition technologies such as roll coating, vapor deposition, misting, etc. Preferably, the release layer has a phase change temperature equal to or lower than any of the solvents or components in functional material 36. A possible material for the release layer is poly(propylene carbonate).

The release layer may also be absorptive of light. In this case, it can serve as the absorptive layer as well. It must be re-applied for each printing step.

Porous Release Layer

The release mechanism of functional material 36 can be improved by applying a thin micro- or nano-structural layer within well 35, between functional material 36 and light-absorbing material layer 34. The release structure needs to be able to contain a solvent, so it has to have pores. Depending on the particle size of functional material 36, the pore size can be either in the micrometer- or nanometer-range. The pores in the release structure are filled with a low boiling point solvent before application of functional material 36. Typically, a low boiling point solvent also has a low phase change temperature, meaning that functional material 36 can be printed with a lower energy light pulse. Alternatively, the solvent from functional material 36 can preferentially go into the pores when it is applied. In both cases, the gas generation within the release structure is less dependent on the properties of functional material 36. This should lead to a more homogeneous process. Also, thermal damage to functional material 36 can be further prevented, as it is not heated in a direct manner.

This may be important when printing biological materials that are thermally fragile. Even without the release layer, this is a "cold" printing process as there is little time to transfer much heat. Functional material 36 will always heat up until it reaches the phase change temperature. However, it is typically less than 1=lm of material that is significantly heated. However, with the release layer, the peak temperature seen by functional material 36 is reduced further.

An alternative to a porous release layer structure for the purpose of helping to eject the functional material is the application of a low surface tension layer between light-absorbing material layer 34 and functional material 36 to enhance the release of functional material 36 as well as enhance the cleanability of the surface after printing and before the subsequent application of more functional material 36. The low surface tension layer may also be selectively applied within a well so as to encourage deposition of functional material 36 onto desired portions of wells 35.

Light-absorbing material layer 34 may be selectively coated with the low surface tension layer to functional material 36 to aid in releasing functional material 36 from wells 35.

As has been described, the present invention provides a method for depositing a functional layer on a substrate. Unlike the LIFT process, the method of the present invention requires no scanning. Unlike the LIFT process, nearly 100% of the functional material is utilized by the method of the present invention. Unlike the LIFT process, there is no by-product or waste such as unused paste or transfer tape with the method of the present invention.

While the invention has been particularly shown and described with reference to a preferred embodiment, it will be understood by those skilled in the art that various changes in form and detail may be made therein without departing from the spirit and scope of the invention.

What is claimed is:

1. A method for depositing a functional material on a substrate, said method comprising:
   providing a plate having a first surface and a second surface, wherein said second surface is curved;
   removing materials from said second surface to form a first well and a second well within said second surface;
   coating said second surface of said plate and said first and second wells within said second surface of said plate with a layer of light-absorbing material such that said layer of light-absorbing material is in complete contact with entire surfaces of said first and second wells formed by only said plate;
   filling said first and second well within said second surface of said plate with a functional material after said coating of said light-absorbing material layer; and
   irradiating said plate with a pulsed light from a non-collimated light source to heat said light-absorbing material in order to generate gas at an interface between said light-absorbing material and said functional material to release said functional material from said well onto a receiving substrate.

2. The method of claim 1, wherein said receiving substrate's surface for receiving said functional material is curved.

3. The method of claim 1, wherein said first and second wells have different depths.

4. The method of claim 1, wherein said plate including said entire well is optically transparent.

5. The method of claim 1, wherein said plate is made of quartz.

6. The method of claim 1, wherein said light-absorbing material is tungsten.

7. The method of claim 1, wherein said non-collimated light source is a flashlamp.

8. The method of claim 1, wherein said non-collimated light source is a laser and a waveguide.

* * * * *